(12) United States Patent
Disney

(10) Patent No.: US 9,991,230 B2
(45) Date of Patent: Jun. 5, 2018

(54) INTEGRATED CIRCUITS AND METHODS FOR FABRICATING INTEGRATED CIRCUITS AND ELECTRICAL INTERCONNECTS FOR III-V SEMICONDUCTOR DEVICES

(71) Applicant: Globalfoundries Singapore Pte. Ltd., Singapore (SG)

(72) Inventor: Donald Ray Disney, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days. days.

(21) Appl. No.: 15/233,235

(22) Filed: Aug. 10, 2016

(65) Prior Publication Data

US 2018/0047705 A1     Feb. 15, 2018

(51) Int. Cl.
| | |
|---|---|
| *H01L 25/065* | (2006.01) |
| *H01L 23/538* | (2006.01) |
| *H01L 21/768* | (2006.01) |
| *H01L 21/3205* | (2006.01) |
| *H01L 21/285* | (2006.01) |

(52) U.S. Cl.
CPC .... *H01L 25/0657* (2013.01); *H01L 21/28575* (2013.01); *H01L 21/32051* (2013.01); *H01L 21/76802* (2013.01); *H01L 23/5383* (2013.01); *H01L 23/5386* (2013.01); *H01L 2225/06527* (2013.01); *H01L 2225/06568* (2013.01)

(58) Field of Classification Search
CPC ............ H01L 25/0657; H01L 23/5386; H01L 21/76802; H01L 21/28575; H01L 23/5383; H01L 21/32051; H01L 2225/06527; H01L 2225/06568
See application file for complete search history.

(56) References Cited

U.S. PATENT DOCUMENTS

| | | | |
|---|---|---|---|
| 2010/0012992 A1* | 1/2010 | Pidin .................. | H01L 21/2686 257/288 |
| 2015/0014778 A1* | 1/2015 | Cheng ................ | H01L 23/5226 257/369 |

* cited by examiner

*Primary Examiner* — Jay C Chang
*Assistant Examiner* — Charles R Peters
(74) *Attorney, Agent, or Firm* — Lorenz & Kopf, LLP

(57) ABSTRACT

Integrated circuits, methods for fabricating integrated circuits, and methods for fabricating electrical interconnects for III-V devices are provided. In an embodiment, a method for fabricating an integrated circuit includes providing a III-V device over and/or within a semiconductor substrate. The method further includes forming a conductive layer over the semiconductor substrate and electrically connected to the device. The conductive layer has an upper surface. Also, the method includes forming a plurality of dielectric material areas over the upper surface of the conductive layer to define covered portions and uncovered portions of the upper surface of the conductive layer. The method includes depositing an interconnect metal over the plurality of dielectric material areas and over the uncovered portions of the upper surface of the conductive layer. The interconnect metal is electrically connected to the upper surface of the conductive layer.

18 Claims, 3 Drawing Sheets

INTEGRATED CIRCUITS AND METHODS FOR FABRICATING INTEGRATED CIRCUITS AND ELECTRICAL INTERCONNECTS FOR III-V SEMICONDUCTOR DEVICES

TECHNICAL FIELD

The technical field generally relates to electrical interconnects in integrated circuits, and more particularly relates to electrical interconnects between group III-V semiconductor devices and other devices.

BACKGROUND

Group III-V semiconductor devices are semiconductor devices formed from compounds with at least one group III element (IUPAC group 13) and at least one group V element (IUPAC group 15). Group III elements include boron, aluminum, gallium, indium, and thallium. Group V elements include nitrogen, phosphorus, arsenic, antimony, and bismuth. Currently, nitrogen is the most commonly used group V element in semiconductor devices.

Group III-V semiconductor compounds, such as gallium nitride (GaN) and its related alloys, are known to be well suited for the formation of optical devices. The large bandgap and high electron saturation velocity of the group III-V semiconductor compounds also make them excellent candidates for applications in high temperature and high-speed power electronics. For example, GaN is frequently used in forming diodes and transistors including light-emitting diodes (LEDs), laser diodes, UV photodetectors. GaN devices are particularly suited for use in power devices that are required to provide high current capability, such as radiofrequency (RF) amplification, high voltage power amplification, and optoelectronics.

However, it is difficult to obtain GaN bulk crystals due to the high equilibrium pressure of nitrogen at typical growth temperatures. To form GaN devices, GaN is commonly deposited epitaxially on silicon having a (111) crystal orientation. However, silicon (111) substrates suffer from interface traps and are not suitable for the formation of complementary metal oxide semiconductor (CMOS) devices. Therefore, GaN device fabrication and CMOS device fabrication are not commonly integrated over a common substrate.

To form integrated circuits with GaN devices and CMOS devices, CMOS devices are typically formed on a first substrate, such as a silicon (100) substrate and GaN devices are formed on a second substrate, such as a silicon (111) substrate. The GaN devices and CMOS devices are then connected together using various approaches including assembling the GaN and CMOS devices in separate semiconductor packages and connecting them on a printed circuit board, assembling the GaN and CMOS devices into a single package and connecting them via the package conductive materials and/or wire bonds, or using layer transfer techniques to physically couple the CMOS devices in their substrate and the GaN devices in their substrate. In the latter approach, electrical interconnects between GaN devices and CMOS devices can be formed using back-end-of-line (BEOL) semiconductor processes, such as the formation of multiple levels of dielectric layers and metal interconnection layers. Such interconnections between integrated GaN and CMOS devices have encountered issues such as poor adhesion of the metal layers. Further, current methods for electrically connecting GaN devices and CMOS devices are time-consuming and expensive.

Accordingly, it is desirable to provide an improved method for fabricating integrated circuits using layer transfer methods to physically couple III-V devices and CMOS devices. Also, it is desirable to provide an improved method for fabricating electrical interconnects to couple CMOS devices and III-V devices. It is further desirable to provide integrated circuits having III-V devices and CMOS devices with electrical interconnects therebetween. Furthermore, other desirable features and characteristics will become apparent from the subsequent detailed description and the appended claims, taken in conjunction with the accompanying drawings and this background.

BRIEF SUMMARY

Integrated circuits, methods for fabricating integrated circuits, and methods for fabricating electrical interconnects for III-V devices are provided. In an exemplary embodiment, a method for fabricating an integrated circuit includes providing a first device over and/or within a semiconductor substrate. The first device is a III-V device. The method further includes forming a first conductive layer over the semiconductor substrate and in electrical contact with the first device. The first conductive layer has an upper surface. Also, the method includes forming a plurality of dielectric material areas over the upper surface of the first conductive layer to define covered portions and uncovered portions of the upper surface of the first conductive layer. The method includes depositing a first interconnect metal over the plurality of dielectric material areas and over the uncovered portions of the upper surface of the first conductive layer. The first interconnect metal is in electrical contact with the upper surface of the first conductive layer.

In another exemplary embodiment, a method for fabricating an electrical interconnect for a III-V device is provided. The method includes providing a semiconductor substrate with the III-V device and with an upper conductive surface. The method further includes depositing a dielectric material over the upper conductive surface. The dielectric material has an upper surface. Also, the method includes etching selected portions of the dielectric material to form openings exposing underlying portions of the upper conductive surface. The method includes depositing a first interconnect material in the openings. The first interconnect material has an upper surface. The method also includes forming a second conductive layer over the upper surface of the first interconnect material and electrically coupled with the first interconnect material.

In yet another exemplary embodiment, an integrated circuit includes a semiconductor substrate and a III-V device located over and/or within the semiconductor substrate. The integrated circuit also includes a first conductive material layer overlying the semiconductor substrate and electrically connected to the III-V device. The integrated circuit includes a plurality of detached dielectric areas overlying the first conductive material layer. Also, the integrated circuit includes a first interconnect material overlying the first conductive material layer and located between and over the plurality of detached dielectric areas. The first interconnect material has an upper surface. The integrated circuit also includes a CMOS device overlying the semiconductor substrate and electrically connected to the III-V through the upper surface of the first interconnect material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
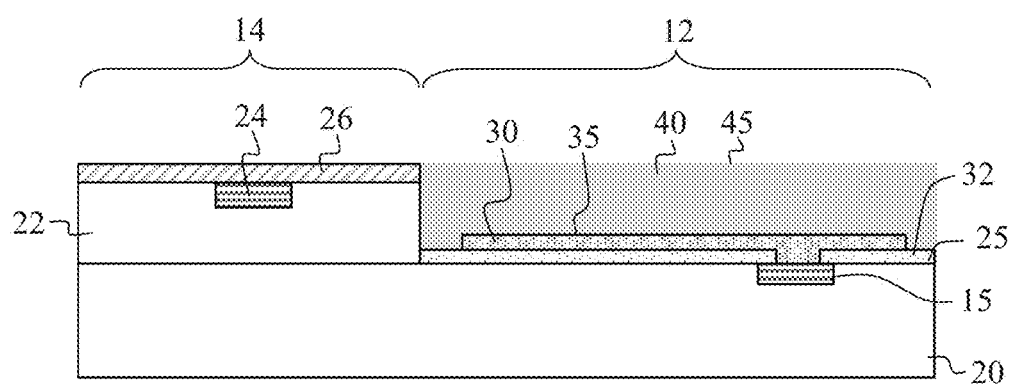
FIGS. 1-3 are cross section views of integrated circuit fabrication processing for forming a coupled III-V device and CMOS device in accordance with an embodiment herein.

The following detailed description is merely exemplary in nature and is not intended to limit the integrated circuits, methods for fabricating integrated circuits, and methods for fabricating electrical interconnects for III-V devices. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various processes in the fabrication of III-V devices and CMOS devices are well-known and so, in the interest of brevity, many conventional processes will only be mentioned briefly herein or will be omitted entirely without providing the well-known process details. Further, it is noted that III-V devices, CMOS devices, and electrical interconnects include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "under", "lower", "higher" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As described herein, an electrical interconnect is formed to connect a III-V device conductive layer to a CMOS device conductive layer. The III-V device conductive layer may be the uppermost metallization layer over a III-V device. The electrical interconnect includes a patterned lower surface that is connected to the III-V conductive layer along a first contact surface having a first contact area. The patterned lower surface includes discrete surface portions that are non-connected to one another, i.e., are non-contiguous, and that lie in a common plane. Further, the electrical interconnect includes a non-patterned upper surface, i.e., a single planar surface contiguous from edge to edge of the upper surface of the electrical interconnect, that serves as a second contact surface for connection to the CMOS device conductive layer. The second contact surface has a second contact area greater than the first contact area. The second contact surface is deliberately formed with the second contact area being larger than a corresponding CMOS contact area to provide allowance so that electrical interconnection between the CMOS device and the III-V device occurs during BEOL processing despite imperfect alignment.

As described below, the lower surface of the electrical interconnect is created by forming discrete dielectric material areas over the III-V device conductive layer. Then, the electrical interconnect is formed between, around and over the dielectric material areas and III-V device conductive layer. The electrical interconnect encapsulates the dielectric material areas. As a result, the electrical interconnect includes a lower region that is lower than, i.e., closer to the underlying substrate than, the top surface of the dielectric material areas. The lower region forms the patterned lower surface for direct electrical connection to the III-V device conductive layer. Further, the electrical interconnect includes an upper region that is higher than, i.e., farther from the underlying substrate than, the top surface of the dielectric material areas. The upper region forms the non-patterned upper surface for electrical connection to the CMOS device conductive layer.

The process described herein substantially reduces the amount of conductive material, such as tungsten, used in the electrical interconnect. Further, the process described herein reduces the cost of the electrical interconnect material deposition process. Exemplary embodiments provide for reduced mechanical stress in the electrical interconnect and reduced peeling or other mechanical failure. Also, the dielectric material areas improve adhesion of the electrical interconnect to the III-V device conductive layer.

In FIG. 1, a partially fabricated integrated circuit 10 is illustrated and includes a III-V device 15 is formed in and/or over a semiconductor substrate 20. The III-V device 15 may include a plurality of layers including III-V semiconductor compounds and alloys, and may be fabricated according to conventional deposition and lithography processes for forming III-V semiconductor devices. An exemplary III-V device 15 includes layers such as GaN, InGaN, AlGaN and/or AlInGaN compound layers. Further, it is noted that the III-V device 15 is not drawn to scale. An exemplary semiconductor substrate 20 may be provided as a bulk semiconductor substrate, or may be provided as a semiconductor-on-insulator (SOI) substrate, which includes a support substrate, an insulator layer on the support substrate, and a layer of semiconductor material on the insulator layer. The semiconductor substrate 20 may be a suitable semiconductor material as typically used in the semiconductor industry, e.g., relatively pure silicon or silicon admixed with other elements such as germanium, carbon, and the like, germanium, gallium arsenide, or the like, or may include a compound semiconductor such as indium arsenide or indium phosphide. An exemplary semiconductor substrate 20 is a silicon substrate, such as a silicon substrate having a (111) crystal orientation, with one or more overlying layers of GaN or similar III-V materials.

In the embodiment shown, III-V device 15 is formed in a III-V device area 12 of substrate 20 that is laterally adjacent to a CMOS device area 14. A CMOS device layer 22 is formed over, and is physically coupled to substrate 20. An exemplary CMOS device layer 22 is a silicon (100) substrate. The CMOS device layer 22 may be another semiconductor material or materials on which a CMOS device may be formed. As shown, a CMOS device 24 is formed in CMOS device layer 22. A protection layer 26 may be formed over the CMOS device 24 and CMOS device layer 22. An exemplary protection layer 26 may include a dielectric such as silicon oxide or the like.

In an exemplary embodiment, the CMOS device 24 is formed on the CMOS device layer 22. Then, the CMOS device layer 22 is bonded to the semiconductor substrate 20 in the CMOS device region 14. Alternatively, the CMOS device layer 22 may be formed on the substrate 20 before the CMOS device 24 is formed.

As shown, the semiconductor substrate 20 and III-V device 15 are formed with an upper surface 25. An insulating layer 32 is formed over the upper surface 25. A hole is etched through the insulating layer 32 in alignment with the III-V device 15. Further, a conductive layer 30 is formed over the insulating layer 32 and in the hole such that the conductive layer 30 is in electrical contact with the upper surface 25 of the III-V device 15 and electrically connected to the III-V device 15. As such, the conductive layer 30 may be considered a III-V device conductive layer 30. For example, a conductive material may be deposited over the insulating layer 32 and III-V device 15 and etched to form the conductive layer 30. An exemplary conductive layer 30 is aluminum or copper. In an exemplary embodiment, the conductive material forming the conductive layer 30 may be deposited by chemical vapor deposition (CVD) or physical vapor deposition (PVD) processes. The conductive layer 30 and/or III-V device 15 may include a plurality of conductive layers electrically interconnected through intervening dielectric layers. The conductive layer 30 terminates at an upper surface 35.

In FIG. 1, a dielectric material 40 is deposited around and over the conductive layer 30 and over the insulating layer 32. An exemplary dielectric material 40 is silicon oxide, through other suitable dielectric materials may be used, such as silicon nitride, low-K dielectric materials, spin-on dielectric materials, and the like. In an exemplary embodiment, the dielectric material 40 is deposited by a CVD process. The method may provide for planarization of the dielectric material 40 to form a planar upper surface 45, such as by chemical mechanical planarization (CMP).

Figure 2:
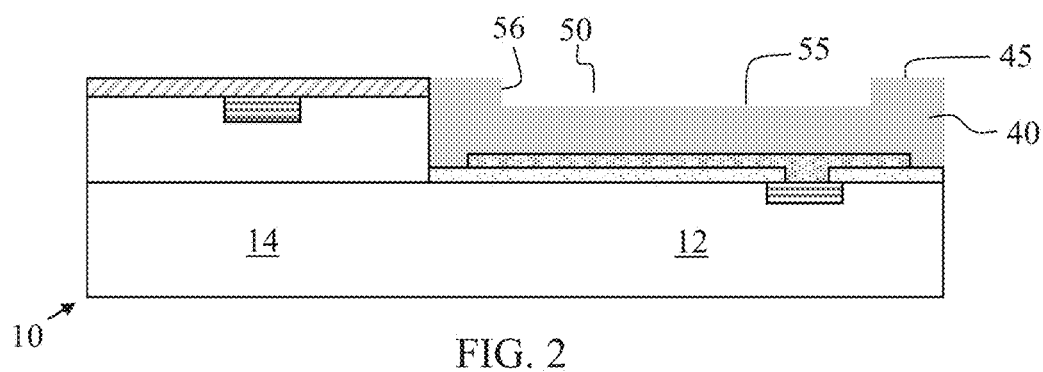

In FIG. 2, a portion of the upper surface 45 of the dielectric material 40 is etched to form a recess 50 in the dielectric material 40. For example, a mask may be deposited and patterned over the dielectric material 40. Then, an etch process may be performed to recess the portion of the dielectric material 40 not covered by the mask. In an exemplary embodiment, the etch process may be a dry etch such as a plasma etch or a wet etch such as hydrofluoric acid etch. The exemplary etch process is substantially anisotropic. After forming the recess 50, the mask is removed. As shown, the recess 50 is bounded by a recessed surface 55 and sidewalls 56 of the dielectric material 40. The thickness of dielectric material 40 is determined by the thickness of the layers in the CMOS device region 14 that is located laterally adjacent the III-V device region 12 and may be, for example, from about 1 to about 2 microns thick. The depth of recess 50 may be a relatively small portion of the total thickness of dielectric material 40. For example, the depth of recess 50 may be from about 0.1 to about 0.4 microns.

Figure 3:
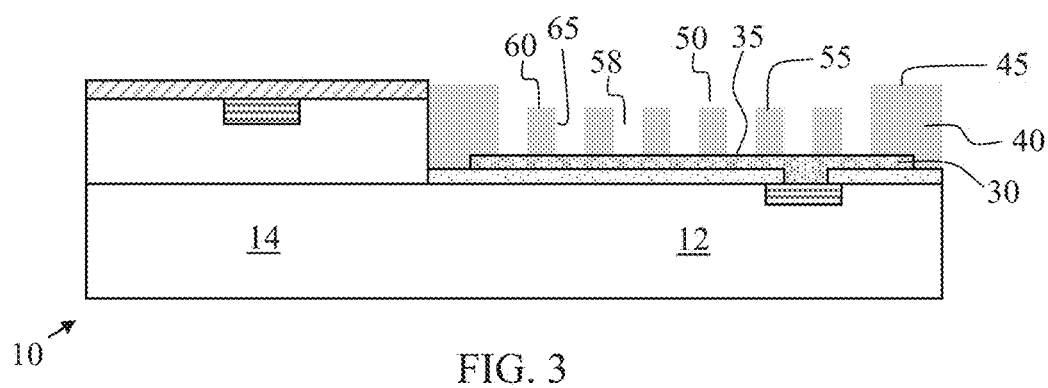

The method may continue in FIG. 3 with the formation of openings 58 in the dielectric material 40 to expose portions of the conductive layer 30. For example, a mask may be deposited and patterned over the dielectric material 40 to selectively expose portions of the recessed surface 55 of the dielectric material 40. Then, an etch process may be performed to remove the exposed portions of the dielectric material 40, i.e., the portions not covered by the mask. In an exemplary embodiment, the etch process is a dry etch such as a plasma etch. The exemplary etch process is anisotropic. In an exemplary embodiment, the openings have a depth: width aspect ratio of at least about 1.5:1 After forming the openings 58, the mask is removed. As shown, the openings 58 extend completely through the dielectric material 40 from the conductive layer 30 to the recess 50. As a result, dielectric material areas 60 are defined between adjacent openings 58. The geometry of the openings 58 and of the dielectric material areas 60 may be formed as desired. Openings 58 may have a high aspect ratio (depth divided by width) such that they may be easily filled during the conductive layer deposition described below. For example, openings 58 may have an aspect ratio of at least about 1.5, a width of from about 0.2 to about 0.4 microns and a depth of from about 0.6 to about 1.6 microns. Openings 58 lie directly over non-covered portions of the upper surface 35 of the conductive layer 30 while the dielectric material areas 60 lie directly over covered portions of the upper surface 35 of the conductive layer 30.

Figure 4:
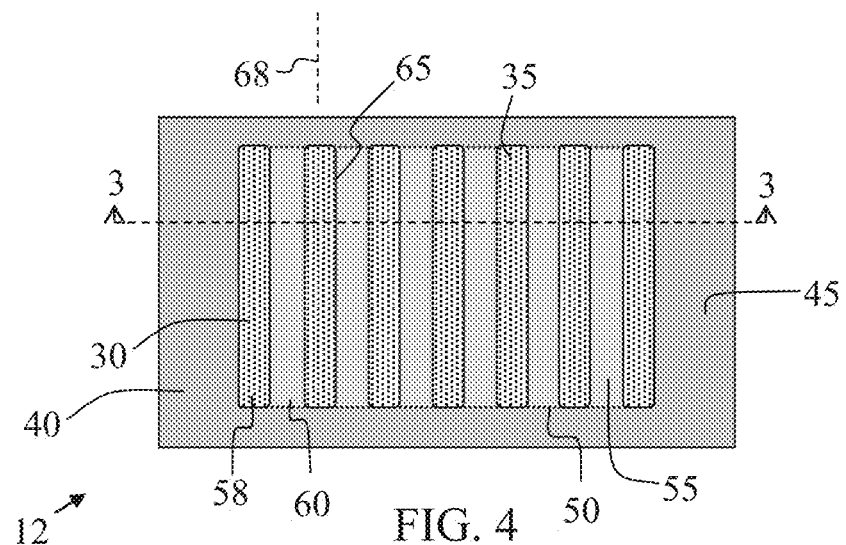
FIGS. 4 and 5 are overhead views of alternative embodiments of the structure of the III-V device region of FIG. 3.
Figure 5:
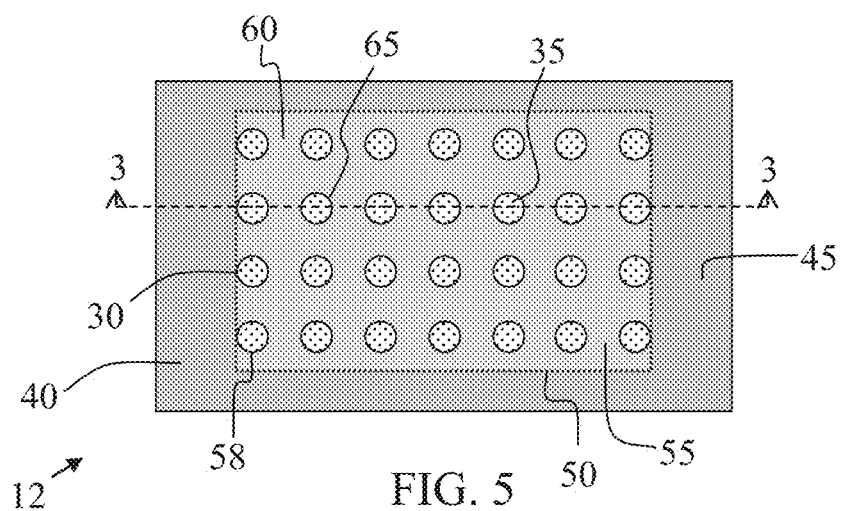

FIGS. 4 and 5 illustrate an overhead view of alternate embodiments of the III-V device region 12 of the partially fabricated integrated circuit 10 of FIG. 3. The cross section view of the III-V device region 12 in FIG. 3 may be taken along line 3-3 in FIG. 4 or line 3-3 in FIG. 5. In FIG. 4, the openings 58 are formed as linear slots with substantially parallel sidewalls 65 that extend in the direction of major axis 68. Accordingly, the dielectric material areas 60 are formed as linear parallel areas through the recess 50 and interconnect with one another at the non-recessed portion of the dielectric material 40.

In FIG. 5, the openings are substantially cylindrical with circular sidewalls 65. Other shapes such as square, rectangular, or hexagonal, may also be used. As a result, the dielectric material areas 60 are detached or physically disconnected within recess 50 only along the horizontal cross sections (such as along line 3-3) or along vertical cross sections that pass through the openings 58. While FIGS. 4 and 5 illustrate two embodiments of the openings 58 and dielectric material areas 60, other arrangements are contemplated in which at least a portion of the upper surface 35 of the conductive layer 30 is covered by a dielectric material area 60.

Figure 6:
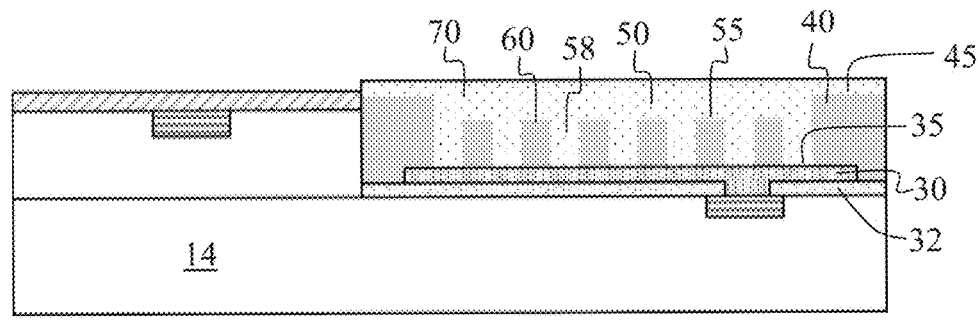
FIGS. 6-8 are cross section views of the structure of FIG. 3 during further integrated circuit fabrication processing for forming the coupled III-V device and CMOS device in accordance with an embodiment herein.

Referring to FIG. 6, the method may continue with the deposition of a conductive material to form a conductive material layer 70 over the upper surface 45 of dielectric material 40, in the recess 50 and over the recessed surface 55 of the dielectric material areas 60, in the openings 58 and on the exposed portions of the upper surface 35 of the conductive layer 30. The conductive material 70 is deposited between, around and over the dielectric material areas 60 and encapsulates the dielectric material areas 60.

An exemplary conductive material is a metal, such as tungsten, aluminum, copper, or alloys thereof. Conductive material layer 70 may also include a stack of several sublayers of different conductive materials. In an exemplary embodiment, the conductive material layer 70 includes a sublayer of titanium (Ti), a sublayer of titanium nitride (TiN), and a sublayer of tungsten (W). Thicknesses of each sublayer may be from about 10 to about 30 nm (of Ti), from about 5 to about 10 nm (of TiN), and from about 200 to about 600 nm (of W). In this example, the Ti sublayer may promote adhesion of the overlying sublayers to the conductive layer 30 and dielectric material 60, the TiN sublayer may serve as a barrier layer to prevent diffusion of the W into the surrounding materials, and the W sublayer may serve to fill the openings 58 in a substantially conformal manner. These materials may be conformally deposited, such as by a CVD process.

Due to the conformal deposition, W forms on the sidewalls 65 and, thus, openings 58 can be completely filled when W is deposited with a thickness only about 1 to about 2 times the initial width of openings 58. Additional W should be deposited to completely fill the recess 50, such that every location along the upper surface of the deposited W extends higher than, i.e., farther from the underlying semiconductor substrate 20 than, upper surface 45. In an exemplary embodiment, the total thickness of deposited W may be from about 0.3 to about 0.8 microns, which is substantially less than the W thickness required to fill a structure lacking dielectric material 60 (e.g., W thickness of from about 1.5 to about 2.0 microns for the same total thickness of dielectric 40). Reducing the deposited W thickness reduces the manufacturing cost and also reduces stress in the W sublayer, which can cause peeling, low yield, and poor reliability.

Figure 7:
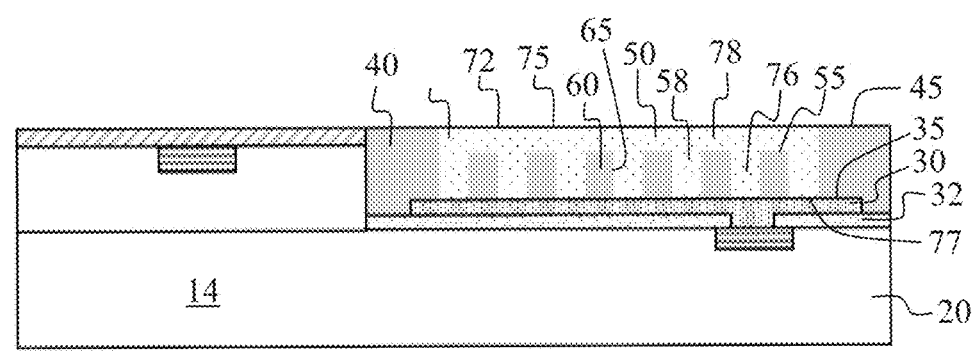

In FIG. 7, the conductive material 70 is planarized to an upper surface 72 co-planar with the upper surface 45 of the dielectric material 40. For example, the conductive material 70 may by planarized by a CMP process. As a result, an electrical interconnect 75 is formed in the recess 50 and in the openings 58 from the conductive material 70. The electrical interconnect 75 includes the upper surface 72. As shown, the electrical interconnect 75 is adheres to not only the horizontal upper surface 35 of the conductive layer 30 and the horizontal recessed surface 55 of the dielectric material areas 60, but also to the vertical sidewalls 65 of the dielectric material areas 60, providing increased adhesion of the electrical interconnect 75 as compared to structures lacking dielectric material areas 60. Increased adhesion prevents the W sublayer from delaminating from (peeling off of) the other materials, greatly improving yield and reliability.

Further, the electrical interconnect 75 includes a lower region 76 that is lower than, i.e., closer to the underlying semiconductor substrate 20 than, the recessed surface 55 of the dielectric material areas 60. The lower region 76 forms the patterned lower surface 77 of the electrical interconnect 75 that directly contacts the III-V device conductive layer 30. Further, the electrical interconnect 75 includes an upper region 78 that is higher than, i.e., farther from the underlying semiconductor substrate 20 than, the recessed surface 55 of the dielectric material areas 60. The upper region 78 forms the non-patterned upper surface 72 for electrical connection to a CMOS device conductive layer as later illustrated.

Figure 8:
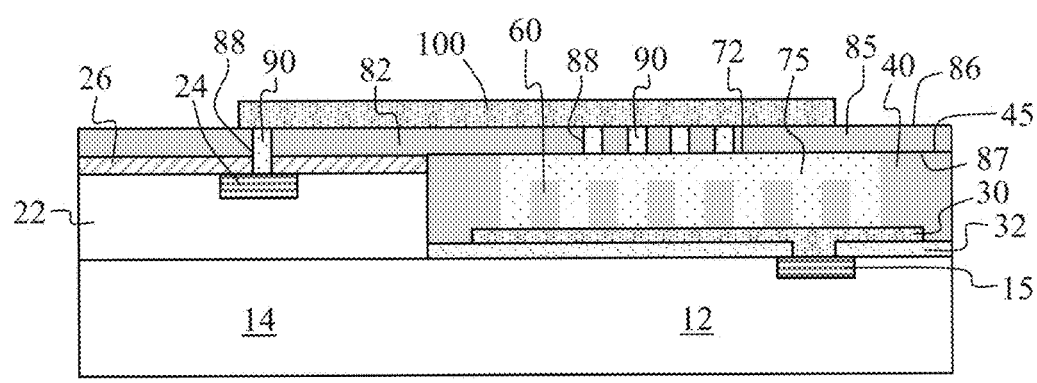

In FIG. 8, an interlayer dielectric 82 is formed over the electrical interconnect 75, dielectric layer 40, and protection layer 26. An exemplary interlayer dielectric is silicon oxide, though other suitable dielectric materials may be used. Further, openings 88 are selectively etched through the interlayer dielectric 82 from the top surface 86 to the bottom surface 87. In the III-V device region 12, the openings 88 contact the electrical interconnect 75. In the CMOS device region 14, the openings 88 (only one opening 88 is illustrated in the CMOS device region in FIG. 8) contact the CMOS device 24. As such, if the protection layer 26 is present, the openings 88 extend through the protection layer 26 and into contact with the second device 24. In an embodiment, a mask (not shown) is formed and patterned over the interlayer dielectric 82. Then, portions of the interlayer dielectric 82 that are not covered by the mask are etched. An exemplary etch process is a dry etch, performed with plasma or vapor. After forming the openings 88, the mask may be removed. Then, a conductive material is deposited and planarized in the openings 88 to form contact plugs 90. A conventional tungsten plug process may be used to form contact plugs 90, such as deposition of Ti, TiN, and/or W, followed by planarization by a CMP process. As a result, conductive contact plugs 90 in the openings 88 have an upper surface 95 coplanar with the top surface 86 of the interlayer dielectric 82. As described above in relation to FIGS. 4 and 5, the openings 88, and contact plugs 90, may be formed with any desired geometry suitable for processing and use.

A conductive layer 100 is formed over the interlayer dielectric 82 and is electrically connected to the contact plugs 90. An exemplary conductive layer 100 is formed by depositing a conductive material over the top surface 86 and surface 94, such as by PVD. A mask (not shown) may be formed and patterned over the conductive material, and the conductive material may be etched to form the conductive layer 100 as shown. An exemplary conductive material is aluminum, copper, or an alloy thereof.

The conductive layer 100 is electrically connected to contact plugs 90 in the III-V device area 12 and in the CMOS device area 14. In the III-V device area 12, contact plugs 90 are aligned with and connected to the electrical interconnect 75, which is electrically connected to III-V device conductive layer 30. In CMOS area 14, contact plug 90 is electrically connected to CMOS device 24. As a result, the III-V device 15 and the CMOS device 24 are electrically coupled.

The structure of FIG. 8 provides for sufficient electrical contact area between the III-V device conductive layer 30 and electrical interconnect 75 while reducing the required tungsten layer thickness and thus the mechanical stress on the electrical interconnect 75 through locating the dielectric material areas 60 on the surface of the conductive layer 30. Yet, the electrical interconnect 75 includes an upper surface 72 defining a sufficient contact area to provide electrical connection to the electrical interconnect 90 despite imperfect alignment of the interlayer dielectric 82 and the dielectric material 40.

As described herein, an exemplary integrated circuit is provided with an improved electrical interconnect 75 that provides electrical communication between a III-V device 15 and a CMOS device 24 formed over dissimilar substrates. Adhesion of the electrical interconnect 75 conductive layer 30 is also increased as compared to conventional approaches. Further, the processes described herein are similar to processes in conventional CMOS processing such that necessary process equipment and actions are available.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating an integrated circuit, the method comprising:
    completing formation of a first device over and/or within a semiconductor substrate, wherein the first device is a III-V device, and wherein the first device has a maximum lateral length from a first end to a second end;
    forming a second device over and/or within a semiconductor substrate, wherein the second device is a CMOS device;
    after completing formation of the first device, forming a first conductive layer over the semiconductor substrate and in electrical contact with the first device, wherein the first conductive layer lies directly over the first device for the entirety of the maximum lateral length of the first device, and wherein the first conductive layer has an upper surface;
    depositing a dielectric material over the upper surface of the first conductive layer;
    etching a recess in the dielectric material to define a recessed surface;
    etching selected areas of the recessed surface to form openings extending from the recessed surface to the upper surface of the first conductive layer, wherein the openings expose uncovered portions of the upper surface of the first conductive layer, and wherein a plurality of dielectric material areas are defined overlying covered portions of the upper surface of the first conductive layer;
    depositing a first interconnect metal over the plurality of dielectric material areas and over the uncovered portions of the upper surface of the first conductive layer, wherein the first interconnect metal is in electrical contact with the first conductive layer;
    depositing an interlayer dielectric over the first interconnect metal and over the second device;
    etching a first opening and a second opening through the interlayer dielectric, wherein the first opening exposes the first interconnect metal and wherein the second opening exposes the second device;
    depositing a second interconnect metal over the interlayer dielectric and in the first opening and the second opening, wherein the second interconnect metal is electrically connected to the first device and to the second device; and
    forming a second conductive layer overlying the second interconnect metal, wherein the second conductive layer electrically connects the first device and the second device.

2. The method of claim 1 wherein depositing the first interconnect metal over the plurality of dielectric material areas and over the uncovered portions of the upper surface of the first conductive layer comprises forming a lower region of the first interconnect metal lower than the recessed surface of the dielectric material and an upper region of the first interconnect metal higher than the recessed surface of the dielectric material.

3. The method of claim 2 further comprising removing an overburden portion of the first interconnect metal from outside of the recess in the dielectric material and forming the upper region of the first interconnect metal with an upper surface.

4. The method of claim 1 wherein depositing the first interconnect metal over the plurality of dielectric material areas and over the uncovered portions of the upper surface of the first conductive layer comprises depositing tungsten over the plurality of dielectric material areas and over the uncovered portions of the upper surface of the first conductive layer.

5. The method of claim 1 wherein depositing the first interconnect metal over the plurality of dielectric material areas and over the uncovered portions of the upper surface of the first conductive layer comprises:
    forming a sublayer of titanium over the plurality of dielectric material areas and over the uncovered portions of the upper surface of the first conductive layer;
    forming a sublayer of titanium nitride over the sublayer of titanium; and
    forming a sublayer of tungsten over the titanium nitride.

6. The method of claim 5 wherein:
    forming the sublayer of titanium comprises forming the sublayer of titanium having a thickness of from 10 to 30 nm of titanium;
    forming the sublayer of titanium nitride comprises forming the sublayer of titanium nitride having a thickness of from 5 to 10 nm; and
    forming the sublayer of tungsten comprises forming the sublayer of tungsten having a thickness of from 200 to 600 nm.

7. The method of claim 1, wherein all of the underlying portions of the first conductive layer exposed by the openings lie in a single plane.

8. The method of claim 1, wherein the first device has an uppermost surface, and wherein the first conductive layer lies over the uppermost surface of the first device.

9. A method for fabricating an electrical interconnect for a III-V device, the method comprising:
    providing a semiconductor substrate with the III-V device, wherein the III-V device has an upper conductive surface;
    forming an insulating layer over the upper conductive surface and over the semiconductor substrate;
    etching a hole through the insulating layer in alignment with the III-V device;
    forming a first conductive layer over the insulating layer and in the hole in electrical contact with the conductive upper surface, wherein the first conductive layer is a contiguous layer extending laterally from a first end to a second end, and wherein all of the III-V device lies directly under the first conductive layer;
    depositing a dielectric material over the first conductive layer, wherein the dielectric material has an upper surface;
    etching selected portions of the dielectric material to form openings exposing underlying portions of the first conductive layer;
    depositing a first interconnect material in the openings, wherein the first interconnect material has an upper surface; and forming a second conductive layer over the upper surface of the first interconnect material and electrically coupled with the first interconnect material.

10. The method of claim 9 wherein etching selected portions of the dielectric material to form openings exposing underlying portions of the first conductive layer comprises etching selected portions of the dielectric material to form openings having a depth:width aspect ratio of at least 1.5:1.

11. The method of claim 9 further comprising etching a recess in the dielectric material to define a recessed surface, wherein etching selected portions of the dielectric material to form openings exposing underlying portions of the first conductive layer comprises etching the recessed surface, and wherein depositing the first interconnect material comprises depositing the first interconnect material in the openings and in the recess.

12. The method of claim 11 wherein depositing the first interconnect material in the openings and in the recess comprises forming a plurality of conductive plugs in the openings and forming a single contiguous upper region of the first interconnect material over the conductive plugs.

13. The method of claim 12 further comprising planarizing the upper region of the first interconnect material to form the upper surface of the first interconnect material co-planar with the upper surface of the dielectric material.

14. The method of claim 9 wherein:
providing the semiconductor substrate with the III-V device comprises providing the semiconductor substrate with a CMOS device;
the method further comprises depositing a second interconnect metal over the first interconnect metal and over the CMOS device; and
the second conductive layer contacts the second interconnect metal.

15. The method of claim 14 wherein the second interconnect metal forms a first conductive plug electrically connected to the III-V device and a second conductive plug electrically connected to the CMOS device, wherein the second conductive layer contacts the first conductive plug and the second conductive plug.

16. The method of claim 14 wherein the method further comprises
depositing an interlayer dielectric over the first interconnect metal and over the second device; and
etching a first opening and a second opening through the interlayer dielectric, wherein the first opening exposes the first interconnect metal, wherein the second opening exposes the CMOS device, wherein depositing the second interconnect metal over the first interconnect metal and over the CMOS device comprises depositing the second interconnect metal over the interlayer dielectric and in the first opening to form a first conductive plug and in the second opening to form a second conductive plug, and wherein the second conductive layer contacts the first conductive plug and the second conductive plug.

17. A method for fabricating an integrated circuit, the method comprising:
providing a first device and a second device over and/or within a semiconductor substrate, wherein the first device is a III-V device, wherein the first device has an uppermost surface, and wherein the second device is a CMOS device;
forming a first conductive layer over the semiconductor substrate and in electrical contact with the first device, wherein the first conductive layer lies over the uppermost surface of the first device and wherein the first conductive layer has an upper surface;
depositing a dielectric material over the upper surface of the first conductive layer;
etching a recess in the dielectric material to define a recessed surface;
etching selected areas of the recessed surface to form openings extending from the recessed surface to the upper surface of the first conductive layer, wherein the openings expose uncovered portions of the upper surface of the first conductive layer, and wherein a plurality of dielectric material areas are defined overlying covered portions of the upper surface of the first conductive layer;
depositing a first interconnect metal over the plurality of dielectric material areas and over the uncovered portions of the upper surface of the first conductive layer, wherein the first interconnect metal is in electrical contact with the first conductive layer;
depositing an interlayer dielectric over the first interconnect metal and over the second device;
etching a first opening and a second opening through the interlayer dielectric, wherein the first opening exposes the first interconnect metal and wherein the second opening exposes the second device;
depositing a second interconnect metal over the interlayer dielectric and in the first opening and the second opening, wherein the second interconnect metal is electrically connected to the first device and to the second device;
forming a second conductive layer overlying the second interconnect metal, wherein the second conductive layer electrically connects the first device and the second device.

18. The method of claim 17, wherein all of the uncovered portions of the upper surface of the first conductive layer lie in a single plane.

* * * * *